(12) United States Patent
Brittain et al.

(10) Patent No.: US 8,005,442 B2
(45) Date of Patent: Aug. 23, 2011

(54) WIRELESS NETWORK CONNECTION SYSTEM AND METHOD USING INJECTION LOCKED OSCILLATORS

(75) Inventors: Candice L Brittain, Nashua, NH (US); Gary J Lawrence, Merrimack, NH (US); Brian M Tomaselli, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 349 days.

(21) Appl. No.: 12/463,382

(22) Filed: May 9, 2009

(65) Prior Publication Data

US 2010/0285751 A1 Nov. 11, 2010

(51) Int. Cl.
*H03C 1/52* (2006.01)
(52) U.S. Cl. ............ 455/108; 455/115.1; 455/208; 455/259
(58) Field of Classification Search ............ 455/91–355
See application file for complete search history.

(56) References Cited

U.S. PATENT DOCUMENTS

| | | | |
|---|---|---|---|
| 2003/0157888 A1* | 8/2003 | Inoue | 455/41 |
| 2005/0272436 A1* | 12/2005 | Trott et al. | 455/450 |
| 2006/0022803 A1* | 2/2006 | Akiyama et al. | 340/10.34 |
| 2009/0011735 A1* | 1/2009 | Zolfaghari et al. | 455/260 |
| 2009/0264074 A1* | 10/2009 | Darabi et al. | 455/41.2 |
| 2010/0330933 A1* | 12/2010 | Tomita | 455/77 |

\* cited by examiner

*Primary Examiner* — Lincoln Donovan
*Assistant Examiner* — Brandon Cole
(74) *Attorney, Agent, or Firm* — Vern Maine and Associates; David A. Rardin

(57) ABSTRACT

A wireless network connection system remotely connects to a network without the use of crystal reference oscillators. This provides communication at long range using a low transmit Effective Isotropic Radiated Power (EIRP). Operation is obtained through a combination of injection locking the system clock to the fundamental frequency of a remote reference oscillator, injection locking the transmitter to the third harmonic of the remote reference oscillator, a micro-watt RF receiver, and a network connection.

20 Claims, 2 Drawing Sheets

WIRELESS NETWORK CONNECTION SYSTEM AND METHOD USING INJECTION LOCKED OSCILLATORS

FIELD OF THE INVENTION

The present invention relates to remotely connecting to a network without the use of crystal reference oscillators at long range using a low transmit Effective Isotropic Radiated Power (EIRP).

BACKGROUND OF THE INVENTION

Wireless networks are expanding into new applications. As they enter more areas, greater flexibility is needed. Network component miniaturization requires techniques to lower power consumption and complexity to support longer unattended operation. Communications between network nodes are also driven by the need for longer ranges.

Wireless sensor networks is one application with these concerns. Energy scavenging and low cost digital and radio frequency (RF) electronics provide some components to support these challenges. However, large crystal reference oscillators are an example of components not meeting the lower power challenges.

What is needed is the ability to communicate over long ranges with low power, a high data rate, and low bit error rate.

SUMMARY OF THE INVENTION

Embodiments use low-power Injection Locked Oscillators (ILO) to frequency lock transmissions and system clocks. This is achieved through the combination of: 1.) injection locking the system clocks to the fundamental of a remote reference oscillator, 2.) injection locking the transmitter to, for example, the third harmonic of the remote reference oscillator, 3.) a micro-watt radio frequency (RF) receiver, and 4.) a network connection.

This combination allows for high transmission data rates, low required transmit levels and the removal of crystal reference oscillators from the design. This system connects to a network and communicates with a remote station at a high data rate and over a long range using a low transmit Effective Isotropic Radiated Power (EIRP).

An embodiment includes a wireless network connection system comprising a remote user interface and a wireless network connection, the remote user interface comprising a reference oscillator; a remote microcontroller operably coupled to the reference oscillator; and an amplitude shift keying (ASK) receiver operably coupled to the remote microcontroller; the wireless network connection comprising an amplitude modulation (AM) detector; a microcontroller operably coupled to the AM detector; a system clock operably coupled to the microcontroller; a network interface operably coupled to the microcontroller; a direct current (DC) switch operably coupled to the microcontroller; a DC power supply operably coupled to the DC switch; and a transmitter operably coupled to the DC switch, wherein the system clock locks to the reference oscillator and the transmitter locks to a harmonic of the reference oscillator.

In other embodiments, the transmitter comprises an injection locked oscillator and the system clock comprises an injection locked oscillator. For yet other embodiments, the system clock locks to the fundamental frequency of the reference oscillator and the harmonic of the reference oscillator is the third harmonic. For still other embodiments, the AM detector operates at micro-watt power and the system operates without a crystal reference oscillator. In some embodiments, the wireless connection employs low transmit effective isotropic radiated power (EIRP) and the system operates with a narrow receive measurement bandwidth. In another embodiment, the reference oscillator, the amplitude shift keying (ASK) receiver, the amplitude modulation (AM) detector, the system clock, and the transmitter each comprises at least one respective antenna.

Another embodiment includes a wireless network connection method, the method comprising the steps of providing a remote user interface having a reference oscillator, a remote microcontroller operably coupled to the reference oscillator, and an amplitude shift keying (ASK) receiver operably coupled to the remote microcontroller; providing a wireless network connection having an amplitude modulation (AM) detector, a microcontroller operably coupled to the AM detector, a system clock operably coupled to the microcontroller, a network interface operably coupled to the microcontroller, a direct current (DC) switch operably coupled to the microcontroller, a DC power supply operably coupled to the DC switch, and a transmitter operably coupled to the DC switch; locking the system clock to the reference oscillator; and locking the transmitter to a harmonic of the reference oscillator.

For some embodiments, the transmitter comprises an injection locked oscillator and the system clock comprises an injection locked oscillator. For other embodiments, the system clock locks to the fundamental frequency of the reference oscillator and the harmonic of the reference oscillator is the third harmonic. In yet other embodiments, the AM detector operates at micro-watt power and the system operates without a crystal reference oscillator. In still yet other embodiments, the wireless connection employs low transmit effective isotropic radiated power (EIRP) and the system operates with a narrow receive measurement bandwidth.

Another embodiment provides a wireless network connection apparatus comprising a remote user interface and a wireless network connection, the remote user interface comprising a reference oscillator comprising an antenna; a remote microcontroller operably coupled to the reference oscillator; an amplitude shift keying (ASK) receiver comprising an antenna and further operably coupled to the remote microcontroller; and a display operably coupled to the remote microcontroller; the wireless network connection comprising a micro-power amplitude modulation (AM) detector comprising an antenna; a microcontroller operably coupled to the AM detector; a system clock comprising an injection locked oscillator, an antenna, and further operably coupled to the microcontroller; a network interface operably coupled to the microcontroller; a direct current (DC) switch operably coupled to the microcontroller; a DC power supply operably coupled to the DC switch; and a transmitter comprising an injection locked oscillator, an antenna, and further operably coupled to the DC switch, wherein the system clock locks to the fundamental frequency of the reference oscillator, and the transmitter locks to a third harmonic of the reference oscillator.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
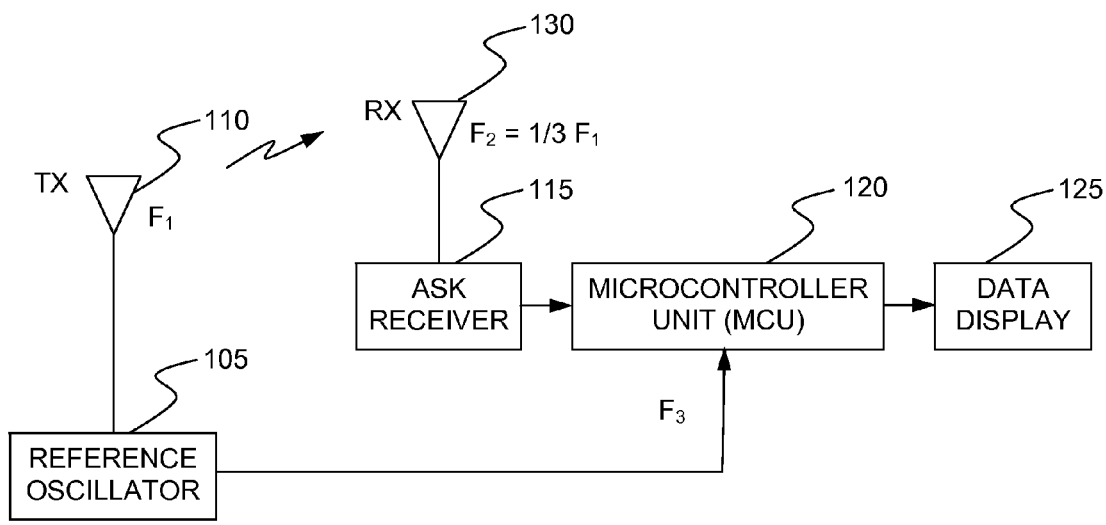
FIG. 1 depicts a remote user interface configured in accordance with an embodiment.
Figure 2:
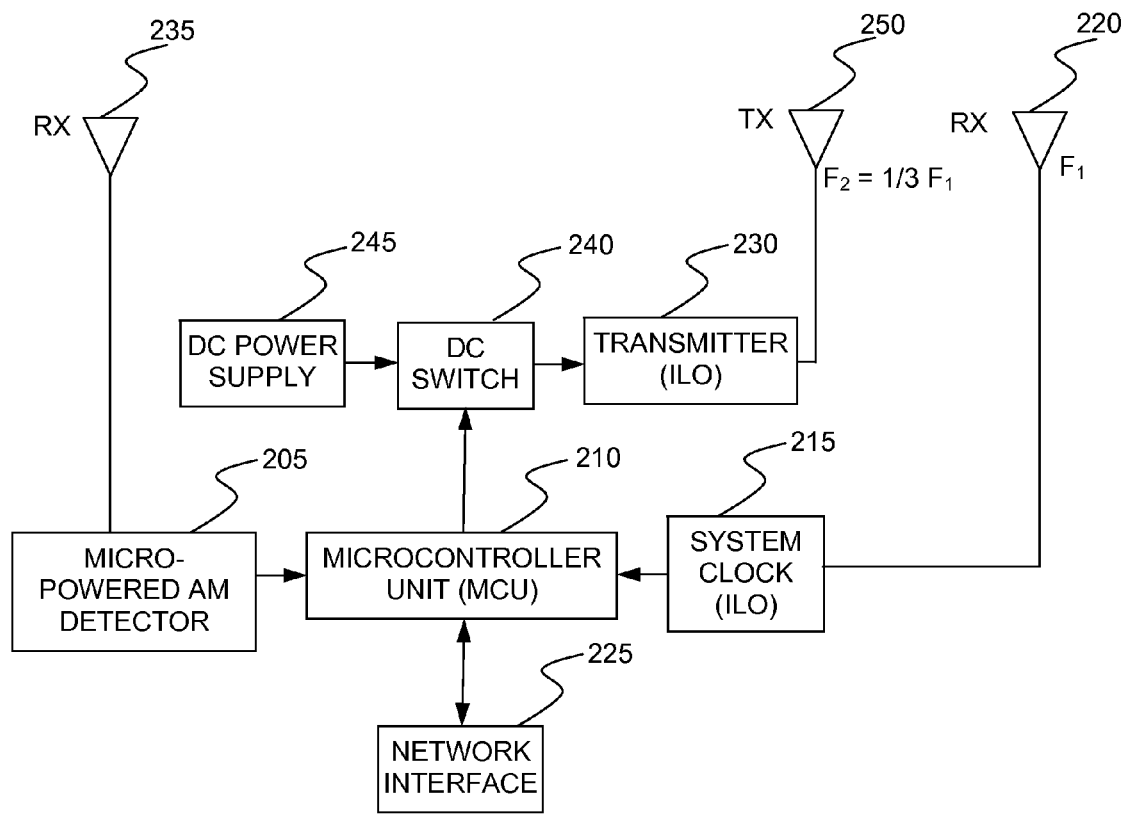
FIG. 2 depicts a wireless network connection configured in accordance with an embodiment.

FIGS. 1 and 2 illustrate an embodiment of the wireless network connection system using injection locked oscillators.

FIG. 1 illustrates remote user interface 100. It comprises reference oscillator 105 transmitting through antenna 110, Amplitude Shift Keying (ASK) receiver 115, microcontroller unit 120, and data display 125. Reference oscillator 105 generates the receive system clock. ASK receiver 115 detects and receives the data transmissions from antenna 250 of FIG. 2 through antenna 130. Microcontroller unit 120 processes the received signal and sends it out to data display 125.

FIG. 2 illustrates wireless network connection 200. It comprises micro-powered amplitude modulation (AM) receiver 205, microcontroller unit 210, system clock 215 connected to antenna 220, network interface 225 and transmitter 230. Microcontroller unit 210 transmits and receives data from network interface 225. Microcontroller unit 210 operates off of injection locked system clock 215. It receives data sent by the remote user interface through antenna 235. Microcontroller unit 210 transmits data by controlling DC switch 240 to turn bias off and on to transmitter 230. DC switch 240 receives power from DC power supply 245. The wireless connection transmits ASK data from transmitter antenna 250 to remote user interface antenna 130 of FIG. 1.

Reference oscillator 105 of FIG. 1 is the injection locking signal source. It is used to frequency lock system clock 215 and transmitter 230. Transmitter 230 is frequency locked to, for example, the third harmonic of reference oscillator 105 of FIG. 1. Frequency locked transmitter 230 allows for a narrow receive measurement bandwidth. A narrow receive measurement bandwidth results in an increased communication range using a low transmit Effective Isotropic Radiated Power (EIRP).

System clock 215 is frequency locked to the fundamental of remote reference oscillator 105 of FIG. 1. A frequency locked system clock 215 allows for the removal of large crystal reference oscillators from the design. Reference oscillator 105 of FIG. 1 is used to clock in the received data at the remote user interface. A system clock 215 that is frequency locked to the receive system allows for high data transmission rates with a low Bit Error Ratio (BER).

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A wireless network connection system comprising:
a remote user interface and a wireless network connection, said remote user interface comprising:
a reference oscillator;
a remote microcontroller operably coupled to said reference oscillator; and
an amplitude shift keying (ASK) receiver operably coupled to said remote microcontroller;
said wireless network connection comprising:
an amplitude modulation (AM) detector;
a microcontroller operably coupled to said AM detector;
a system clock operably coupled to said microcontroller;
a network interface operably coupled to said microcontroller;
a direct current (DC) switch operably coupled to said microcontroller;
a DC power supply operably coupled to said DC switch; and
a transmitter operably coupled to said DC switch, wherein said system clock locks to said reference oscillator and said transmitter locks to a harmonic of said reference oscillator.

2. The system of claim 1, wherein said transmitter comprises an injection locked oscillator.

3. The system of claim 1, wherein said system clock comprises an injection locked oscillator.

4. The system of claim 1, wherein said system clock locks to the fundamental frequency of said reference oscillator.

5. The system of claim 1, wherein said harmonic of said reference oscillator is the third harmonic.

6. The system of claim 1, wherein said AM detector operates at micro-watt power.

7. The system of claim 1, wherein said system operates without a crystal reference oscillator.

8. The system of claim 1, wherein said wireless connection employs low transmit effective isotropic radiated power (EIRP).

9. The system of claim 1, wherein said system operates with a narrow receive measurement bandwidth.

10. The system of claim 1, wherein said reference oscillator, said amplitude shift keying (ASK) receiver, said amplitude modulation (AM) detector, said system clock, and said transmitter each comprises at least one respective antenna.

11. A wireless network connection method, said method comprising the steps of:
providing a remote user interface having a reference oscillator, a remote microcontroller operably coupled to said reference oscillator, and an amplitude shift keying (ASK) receiver operably coupled to said remote microcontroller;
providing a wireless network connection having an amplitude modulation (AM) detector, a microcontroller operably coupled to said AM detector, a system clock operably coupled to said microcontroller, a network interface operably coupled to said microcontroller, a direct current (DC) switch operably coupled to said microcontroller, a DC power supply operably coupled to said DC switch, and a transmitter operably coupled to said DC switch;
locking said system clock to said reference oscillator; and
locking said transmitter to a harmonic of said reference oscillator.

12. The method of claim 11, wherein said transmitter comprises an injection locked oscillator.

13. The method of claim 11, wherein said system clock comprises an injection locked oscillator.

14. The method of claim 11, wherein said system clock locks to the fundamental frequency of said reference oscillator.

15. The method of claim 11, wherein said harmonic of said reference oscillator is the third harmonic.

16. The method of claim 11, wherein said AM detector operates at micro-watt power.

17. The method of claim 11, wherein said method operates without a crystal reference oscillator.

18. The method of claim 11, wherein said method employs low transmit effective isotropic radiated power (EIRP).

19. The method of claim 11, wherein said method operates with a narrow receive measurement bandwidth.

20. A wireless network connection apparatus comprising:
a remote user interface and a wireless network connection, said remote user interface comprising:
a reference oscillator comprising an antenna;
a remote microcontroller operably coupled to said reference oscillator;
an amplitude shift keying (ASK) receiver comprising an antenna and further operably coupled to said remote microcontroller; and
a display operably coupled to said remote microcontroller;
said wireless network connection comprising:
a micro-power amplitude modulation (AM) detector comprising an antenna;
a microcontroller operably coupled to said AM detector;
a system clock comprising an injection locked oscillator, an antenna, and further operably coupled to said microcontroller;
a network interface operably coupled to said microcontroller;
a direct current (DC) switch operably coupled to said microcontroller;
a DC power supply operably coupled to said DC switch; and
a transmitter comprising an injection locked oscillator, an antenna, and further operably coupled to said DC switch, wherein said system clock locks to the fundamental frequency of said reference oscillator and said transmitter locks to a third harmonic of said reference oscillator.

* * * * *